United States Patent [19]

Bauer

[11] Patent Number: 5,349,213
[45] Date of Patent: Sep. 20, 1994

[54] TURN-OFF POWER SEMICONDUCTOR DEVICE

[75] Inventor: Friedhelm Bauer, Baden, Switzerland

[73] Assignee: Asea Brown Boveri Ltd., Baden, Switzerland

[21] Appl. No.: 961,880

[22] Filed: Oct. 16, 1992

[30] Foreign Application Priority Data

Oct. 26, 1991 [DE] Fed. Rep. of Germany ....... 4135411

[51] Int. Cl.⁵ .................... H01L 29/74; H01L 29/06
[52] U.S. Cl. .................... 257/147; 257/139; 257/146; 257/162
[58] Field of Search ............. 257/122, 126, 127, 133, 257/135, 138, 144, 146, 152

[56] References Cited

U.S. PATENT DOCUMENTS 4,958,211  9/1990  Temple .

FOREIGN PATENT DOCUMENTS

| | | |
|---|---|---|
| 0262370 | 4/1988 | European Pat. Off. . |
| 0340445 | 11/1989 | European Pat. Off. . |
| 0387721 | 9/1990 | European Pat. Off. . |
| 0409010 | 1/1991 | European Pat. Off. . |
| 0476815 | 3/1992 | European Pat. Off. . |
| 3707867 | 9/1987 | Fed. Rep. of Germany . |
| 3723150 | 1/1988 | Fed. Rep. of Germany . |
| 3832709 | 3/1990 | Fed. Rep. of Germany . |
| 4024526 | 2/1991 | Fed. Rep. of Germany . |
| 0194366 | 8/1988 | Japan ..................... 257/147 |
| 0209172 | 8/1988 | Japan ..................... 257/138 |
| 9103078 | 3/1991 | World Int. Prop. O. . |

OTHER PUBLICATIONS

MOS-Controlled Thyristors–A New Class Of Power Victor A. K. Temple, Member, IEEE 1986 (Oct.) pp. 227–229, vol. ED-33, No. 10.

A New MOS-Gated Power Thyristor Structure With Turn-Off Achieve By Controlling The Base Resistance, M. Nandakumar et al. pp. 1609–1618, IEEE 1991 (May), vol. 12, No. 5.

*Primary Examiner*—Rolf Hille
*Assistant Examiner*—David B. Hardy
*Attorney, Agent, or Firm*—Oblon, Spivak, McClelland, Maier & Neustadt

[57] ABSTRACT

To avoid peripheral current-density overshoots in a turn-off power semiconductor device, in particular an MOS-controlled thyristor MCT having a multiplicity of separate MCT cells ((M1, ..., M3), the unit cells (here: MCT cells (M1, ..., M3)) are combined in groups to form segments (SE) and are surrounded peripherally by peripheral short-circuit regions (10, 15) which are embedded in the semiconductor substrate (1) from the cathode side and are directly connected to the cathode contact (2). At the same time, the peripheral short-circuit regions (10) are of the same conductivity type as the anode-side emitter layer (8).

11 Claims, 5 Drawing Sheets

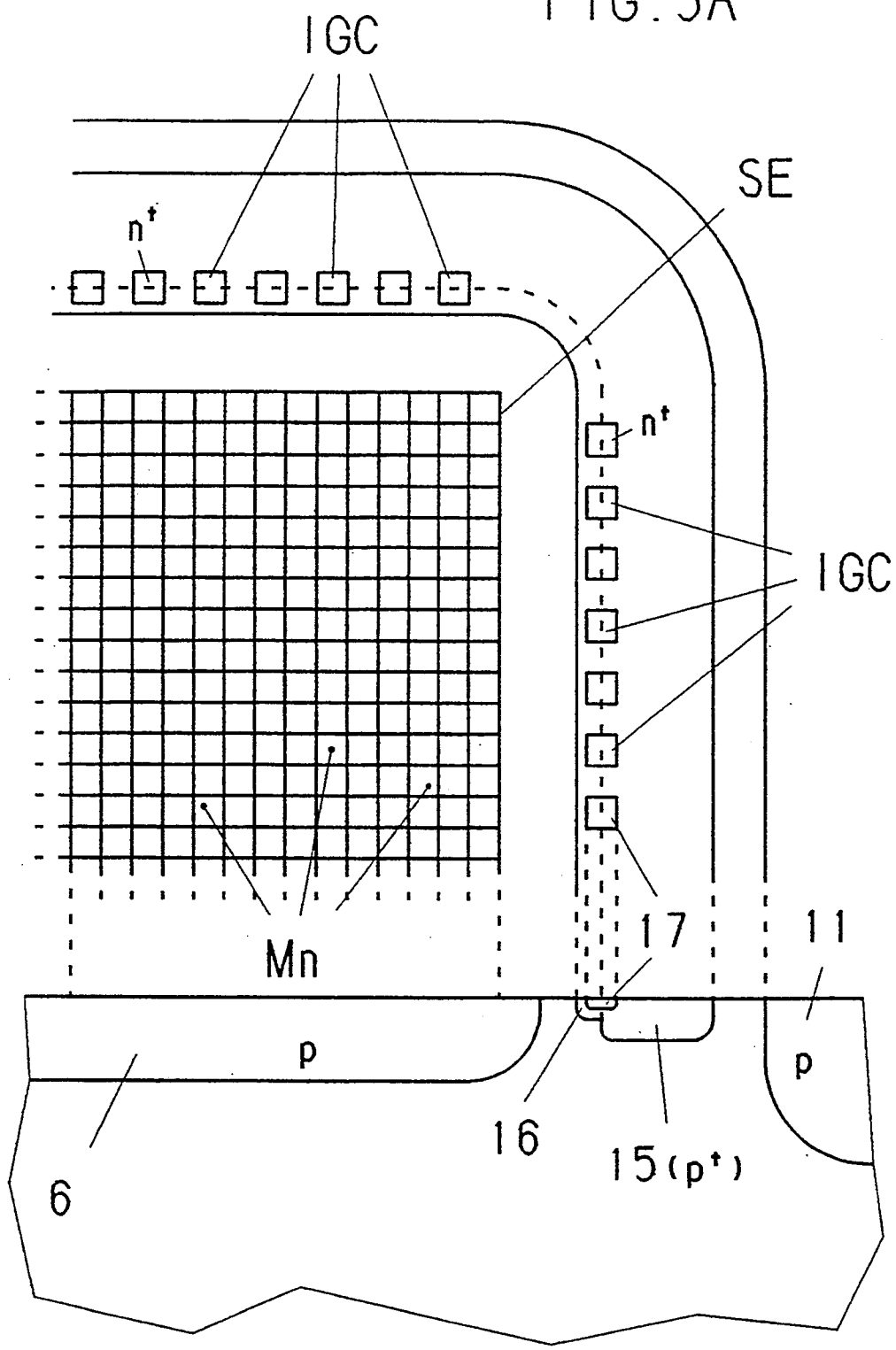

TURN-OFF POWER SEMICONDUCTOR DEVICE

BACKGROUND OF THE INVENTION

1. Field of the Invention

The present invention relates to the field of power electronics. It concerns a turn-off power semiconductor device comprising
   (a) a semiconductor substrate having two oppositely situated principal faces, of which one is assigned to an anode and the other is assigned to a cathode and forms a cathode surface;
   (b) between the anode and the cathode inside the semiconductor substrate, a layer sequence comprising an emitter layer of a first conductivity type, a first base layer of a second conductivity type opposite to the first conductivity type, and a second base layer of the first conductivity type; and
   (c) between the anode and the cathode inside the semiconductor substrate a multiplicity of adjacently disposed turn-off unit cells connected in parallel.

Such a device in the special form of an MOS-controlled thyristor MCT is disclosed, for example, in the paper by V.A.K. Temple, IEEE Trans. Electron Devices, vol. ED-33, pages 1609–1618 (1986).

2. Discussion of Background

Important system simplifications would be feasible in the case of the application in power electronic circuits, in particular in speed-controlled motor drives, if the current control as it is presently known from the GTO could be replaced by voltage control in the case of the power semiconductors used. This transition from current to voltage control has already been completed in the case of smaller powers by the replacement of the conventional bipolar transistors with the recently developed IGBTs (Insulated Gate Bipolar Transistors).

In the case of higher powers, which essentially remain the province of thyristors, efforts to replace the GTO in a similar manner by the development of the MOS-controlled thyristor MCT (MOS Controlled Thyristor) have been under way for a fairly long time. As described in the publication mentioned at the outset, in such an MCT, a multiplicity of MOS-controlled short circuits, which short-circuit the cathode contact to the cathode-side base layer to turn the device off and are consequently able to interrupt the regenerative mechanism of the thyristor, are provided inside a conventional four-layer structure on the cathode side.

Hitherto, however, these efforts have not been very successful because it is precisely also large-area MCTs which continue to suffer from detrimental inhomogeneous current density distributions, in particular during the turn-off phase. It is also such inhomogeneities which result, precisely at the periphery of the cathode-side device structure, in current-density overshoots which may destroy the device or at least impair the normal operation.

SUMMARY OF THE INVENTION

Accordingly, the object of the invention is to provide a turn-off semiconductor device (in particular, also in the form of an MCT), in which the peripheral current-density overshoots are reduced at least to a harmless level.

The object is achieved in a device of the type mentioned at the outset, wherein
   (d) a multiplicity of unit cells are combined in each case into a group of cells and form a segment;
   (e) each segment is surrounded at its periphery in the lateral direction by peripheral short-circuit regions of the first conductivity type; and
   (f) the peripheral short-circuit regions are embedded in the semiconductor substrate from the cathode surface and are conductively connected to a cathode contact disposed on the cathode surface.

The essence of the invention is that the regions (segments) containing the active unit cells are surrounded, at their outer peripheries, by peripheral short-circuit regions which extract charge carriers from the interior of the device and thereby reduce the charge carrier emission and consequently the current loading of the peripheral unit cells.

A first preferred embodiment of the invention is one wherein
   (a) the device is formed as an MOS-controlled thyristor MCT and the unit cells are each formed as MCT cells;
   (b) an emitter region of the second conductivity type, which is embedded in the second base layer and to which contact is made from the cathode surface by the cathode contact, being disposed inside each MCT cell; and
   (e) an MOS structure, which forms a switchable short circuit between the second base layer and the cathode contact, being provided inside each MCT cell on the cathode side.

In the case of the MCT, the peripheral short-circuit regions are able to prevent peripheral current overshoots particularly effectively.

In a second preferred embodiment of the invention, the peripheral short-circuit regions are embedded in the second base layer.

This embodiment can be produced particularly simply and can readily be combined with all the standard structures for peripheral terminations of high-blocking components (mesa-etched peripheral structures, guard rings, bevels, field plates etc.).

A third preferred embodiment is one wherein
   (a) the lateral extension of the second base layer is limited in each case to one segment and, outside the segments, the first base layer emerges at the cathode surface;
   (b) the peripheral short-circuit regions are embedded in the first base layer; and
   (c) MOS-controlled short circuits, which make a switchable connection between the cathode contact and the first base layer and, together with the peripheral short-circuit regions, the first base layer and the emitter layer form IGBT structures, are provided inside the peripheral short-circuit regions.

This combination of peripheral short-circuit regions and MOS-controlled short circuits after the fashion of IGBT structures has the advantage that, on the one hand, the effectiveness of the peripheral short-circuit regions can be controlled by means of a gate and that, on the other hand, the IGBT structures can be used to turn the device on, as is explained, for example, in EP-A1-0 340 445 for the case of alternately disposed MCT and IGBT cells.

Further embodiments emerge from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, Wherein:

FIGS. 3A,B show, in the cathode-side plan view or in cross section, respectively, a further exemplary embodiment, comparable to FIG. 2, in which the IGBT structure of the peripheral short-circuit region is subdivided into separate, insular IGBT cells.

DESCRIPTION OF THE PREFERRED EMBODIMENTS

The explanations given below relate specifically to MOS-controlled thyristors MCTs in which the separate segments contain the MCT cells. It is within the scope of the invention, however, to provide peripheral short-circuit regions in other turn-off power semiconductor devices as well.

Figure 1A:
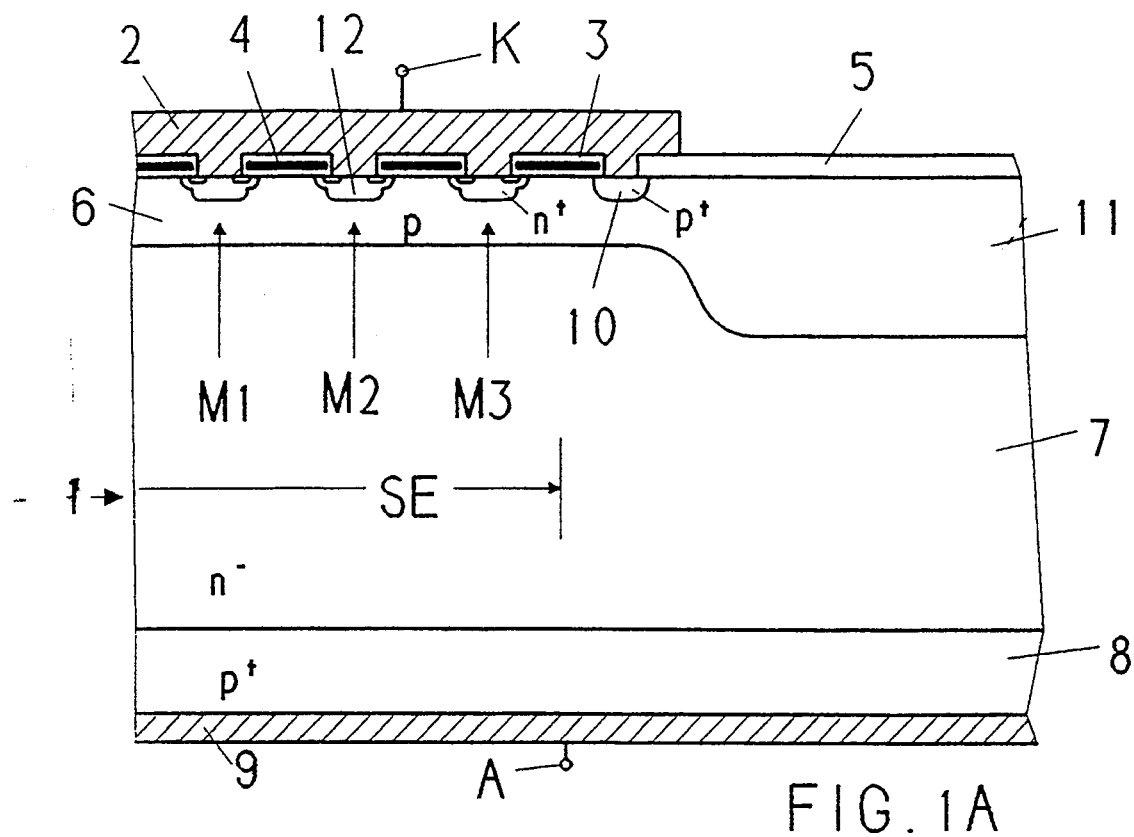
FIG. 1A shows a first exemplary embodiment of a device according to the invention having a peripheral short-circuit region embedded in the second base layer between a group of MCT cells and the peripheral termination region.

Referring now to the drawings, wherein like reference numerals designate identical or corresponding parts throughout the several views, FIG. 1A shows a portion of the cross section of the peripheral region of an MCT according to a first exemplary embodiment of the invention. In a semiconductor substrate 1 having two principal faces, of which one is assigned to an anode A and the other is assigned to a cathode K as cathode surface, the device contains a sequence of four alternately doped layers or regions.

This sequence comprises an (anode-side) emitter layer 8 of a first conductivity type (here: p+-doped), a first base layer 7 of a second conductivity type opposite to the first conductivity type (here:n⁻-doped), a second base layer 6 of the first conductivity type (here: p-doped), and a multiplicity of (cathode-side) emitter regions 12 of the second conductivity type (here: n+-doped). The sequence forms a conventional (p-n-p-n) thyristor structure. The emitter layer 8 is provided with an anode contact 9 in the form of an Al metallization. The emitter regions 12 are correspondingly connected to a cathode contact 2, also formed as Al metallization.

Embedded in the emitter regions 12 are cathode-side MOS-controlled short circuits, which are able to short-circuit the cathode contact 2 to the second base layer 6 for the purpose of turning off. The cathode-side structure with the emitter regions and MOS-controlled short circuits is part of a conventional MCT, each emitter region 12 forming, together with the associated short circuits, an elementary thyristor cell or unit cell (MCT cells M1, ..., M3). The configuration (known per se) of the individual short circuits is only indicated in FIG. 1A (just as in FIG. 1B as well) for reasons of clarity. They may be DMOS structures, but also NMOS structures. Equally, MCT cells M1, ..., M3 may be of insular or strip-type construction. The short circuits are always triggered by gate electrodes 4, which are insulated by gate insulation 3 and disposed above the cathode surface of the semiconductor substrate 1.

The separate, immediately adjacent MCT cells M1, ..., M3 form an interrelated group of cells, a segment SE, which covers a fairly large area (in the extreme case of only one group of cells, even the entire active area) of the semiconductor substrate 1. Problems arise in the prior art at the peripheral regions of such a group of cells, where particularly severe overshoots, which then result in an extreme loading of the MCT cells in the peripheral region, occur in the current density. According to the invention, provision is made for each group of cells to be surrounded at its periphery in the lateral direction by peripheral short-circuit regions 10 of the first conductivity type (here: p+-doped) which project into the semiconductor substrate 1 from the cathode surface and are conductively connected to the cathode contact 2.

In the exemplary embodiment of FIG. 1A (just as in the exemplary embodiment of FIG. 1B as well), the peripheral termination regions 10 are embedded directly in the second base layer 6. At the same time, they may be constructed either as a multiplicity of insular cells or, alternatively, may be of strip-type construction. In this exemplary embodiment, incidentally, the second base layer 6 merges, outside the peripheral short-circuit regions 10, into a peripheral termination region 11, which is also p-doped and which is known per se for high-blocking capability devices from the prior art.

The configuration shown in FIG. 1A offers a particularly simple solution to the problem of peripheral current overshoot: since the high peripheral current density is mainly borne by holes, the illustrated arrangement of p+-type peripheral short-circuit regions 10 in the form of cells or strips along the cathode periphery is sufficient to extract said charge carriers from the device and thus remove the load from the MCT cells M1, ..., M3 which are capable of emission. At this point it may be pointed out that the peripheral short-circuit regions 10 can be produced without additional cost in the production of the MCT structure itself (together with the MOS-controlled short circuits in the MCT cells).

Provided as the actual peripheral termination of the entire device in FIG. 1A is a more deeply driven-in peripheral termination region 11, which is covered by peripheral passivation 5, composed, for example, of SiO$_2$. Within the scope of the invention, other types of peripheral terminations such as, for example, mesa-etched peripheral structures, guard rings, bevel configurations or the like may, of course, also be used instead of such a peripheral termination region 11. An embodiment comparable to FIG. 1A, in which, for example, separate p+-doped guard rings GR1 and GR2 are provided instead of the peripheral termination region 11, is shown in FIG. 1B as an illustration of these possible variations.

Figure 1B:
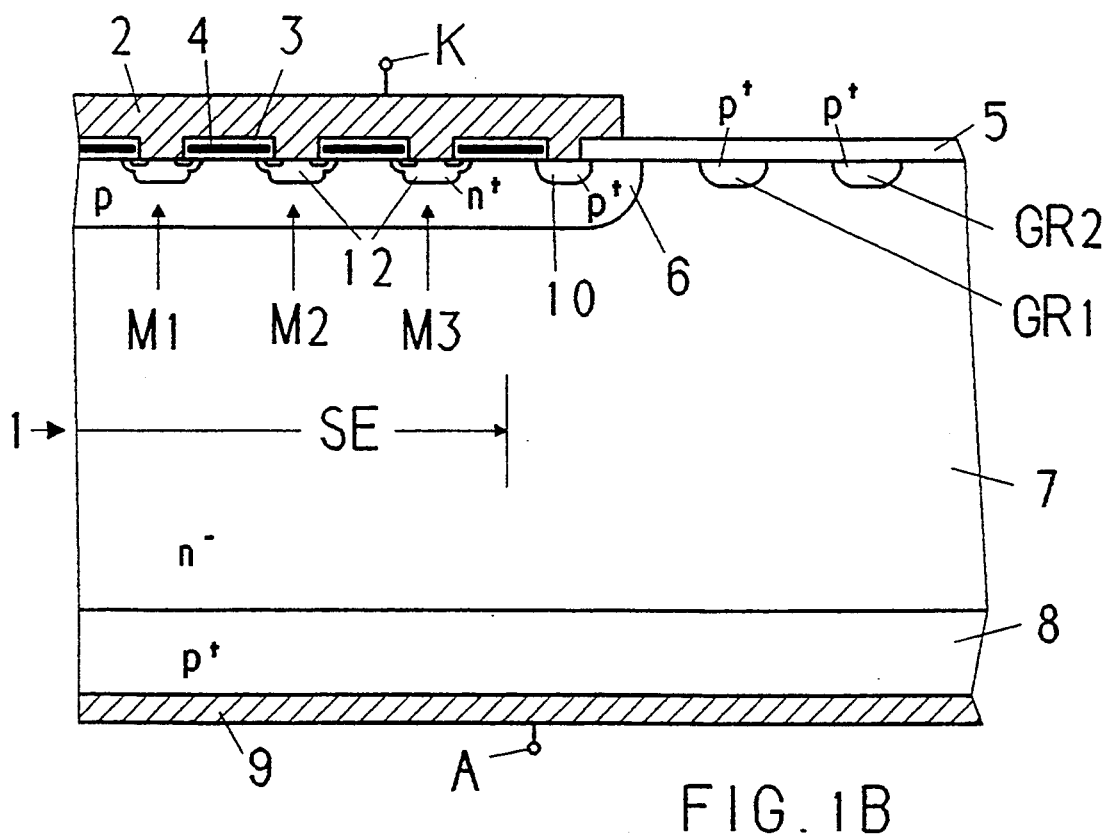
FIG. 1B shows a second exemplary embodiment, comparable to FIG. 1A, in which guard rings are provided as peripheral termination instead of the peripheral termination region.

Although the structures shown in FIGS. 1A and 1B are built up and can be manufactured in a particularly simple way, they also have a disadvantage: the short circuit of the emitter regions 12 is so effective in its action that an appreciable number of MCT cells cannot emit any electrons. The cells cannot therefore contribute to current conduction and consequently reduce the effective emitter area.

Figure 2A:
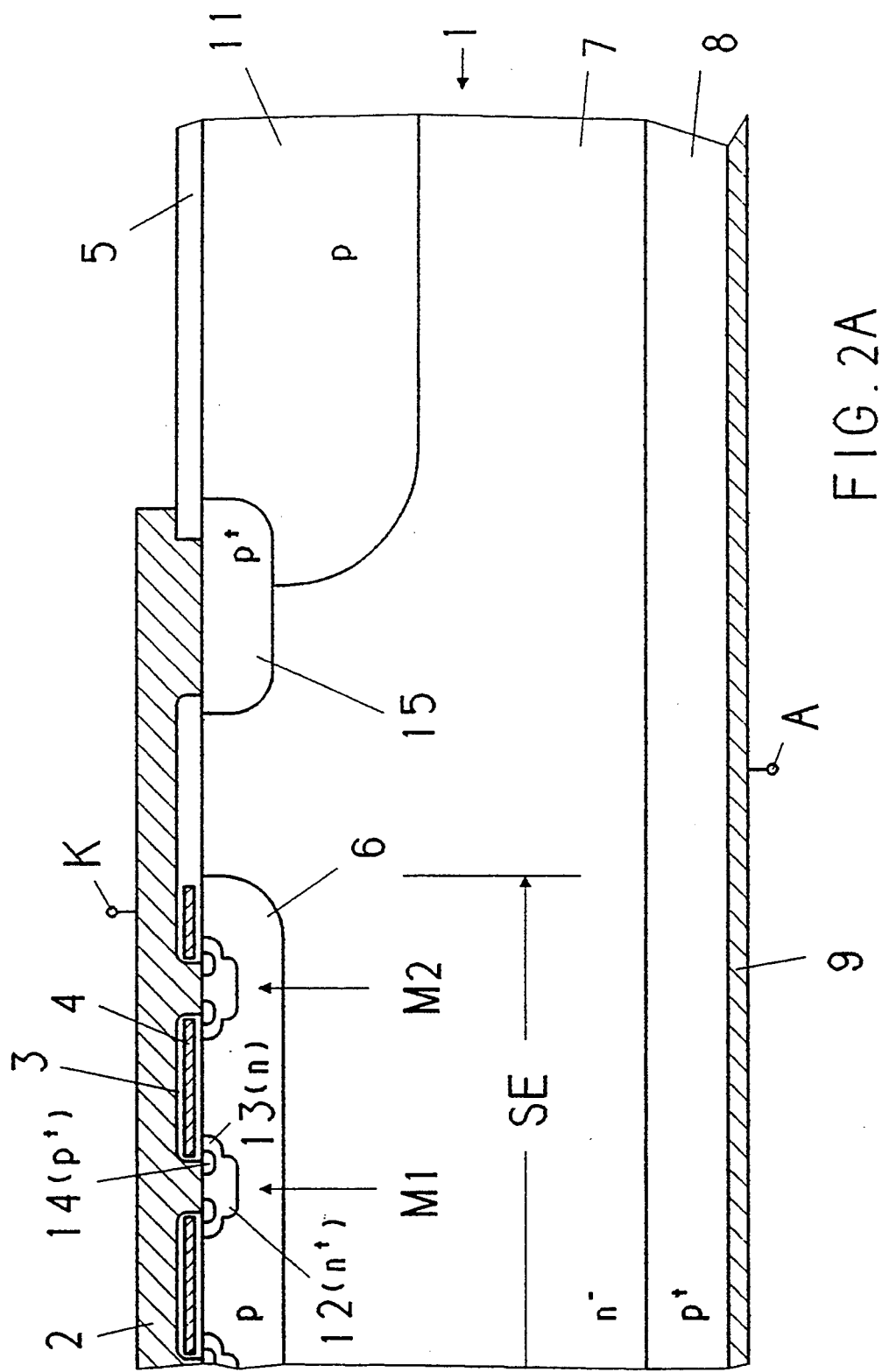
FIG. 2A shows a further preferred exemplary embodiment of an MCT according to the invention, in which the peripheral short-circuit region is embedded directly in the first base layer in a gap between the second base layer and the peripheral termination region.

This problem can be largely solved by the structures shown in FIGS. 2A and B. Here the peripheral short-circuit regions 15 analogous to the regions 10 in FIGS. 1A and 1B are first removed from the second base layer 6 and placed in a gap between second base layer 6 and the peripheral termination region 11, the peripheral short-circuit regions 15 either overlapping the peripheral termination region 11 (FIG. 2A and broken line in FIG. 2B) or being separated from the latter (continuous periphery line of 11 in FIG. 2B). In the latter case, the first base layer 7 emerges at the cathode surface in the gap. In this way, the peripheral short-circuit regions 15 are embedded directly in the first base layer 7.

In FIG. 2A, the peripheral short-circuit regions 15 are constructed without additional structures. Turn-on is also possible here by means of the p-type base periphery.

Figure 2B:
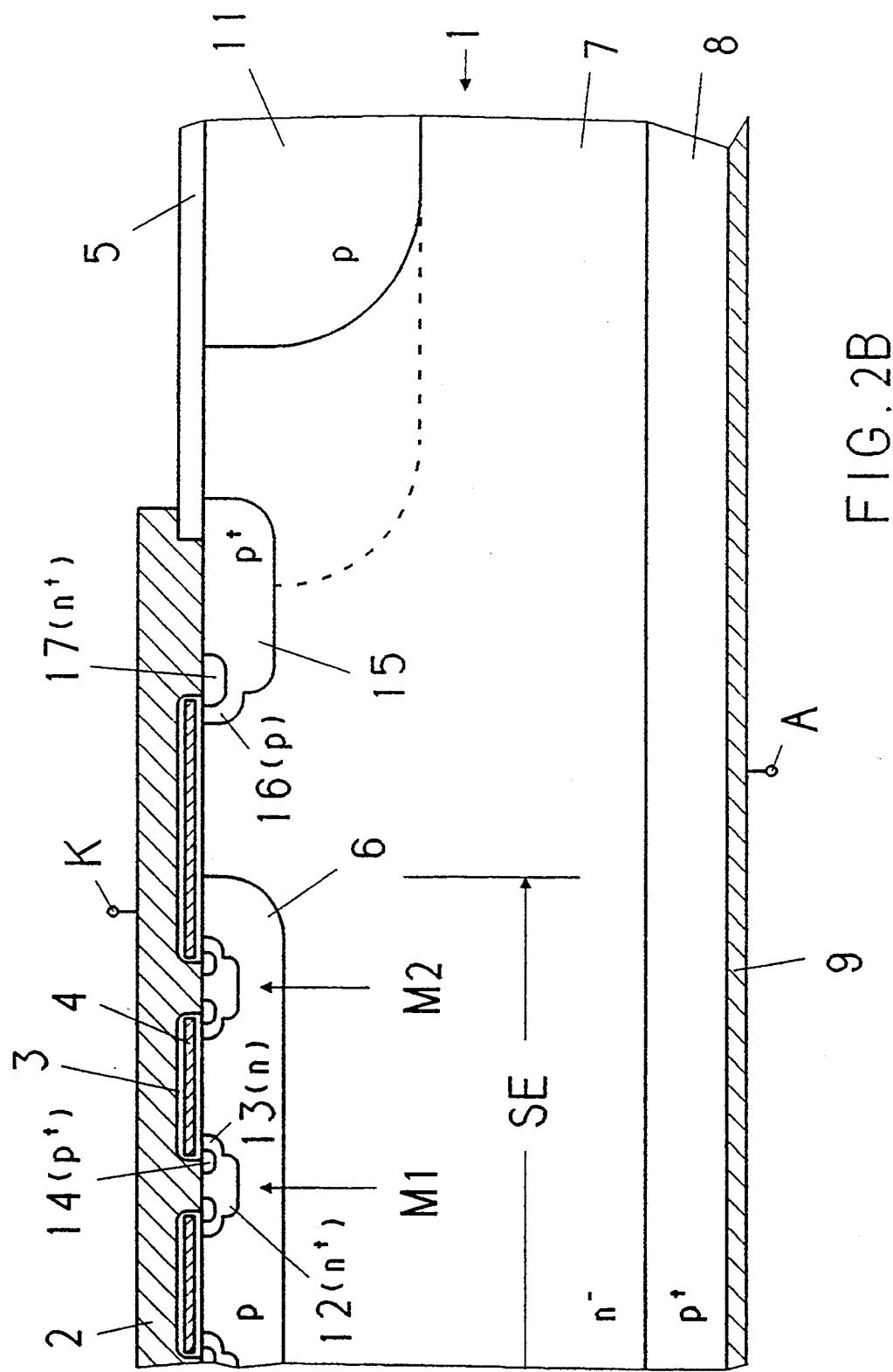
FIG. 2B shows an exemplary embodiment according to FIG. 2A, in which the peripheral short-circuit region additionally has MOS-controlled short circuits on the inside thereby collectively producing an IGBT structure.

In FIG. 2B, MOS-controlled short circuits, which make a switchable connection between the cathode contact 2 and the first base layer 7 and, together with the peripheral short-circuit regions 15, the first base layer 7 and the emitter layer 8 form IGBT structures (IGBT=Insulated Gate Bipolar Transistor), are additionally integrated inside the peripheral short-circuit regions 15 adjacent to the cathode surface. The short circuits themselves each comprise an n+-doped source region 17, a p-doped channel region 16, the first base layer 7 and the gate electrode 4 disposed in an insulating manner above the channel region 16 (the MOS-controlled short circuits in the MCT cells M1, M2 which are shown in more detail in FIG. 2 and which each comprise an n-doped channel region 13 and a p+-doped cathode short-circuit region 14 as source region have a comparable, but complementary configuration).

In the peripheral short-circuit regions 15, the IGBT structures are preferably disposed only on the inside, i.e. adjacent to the active surface of the device. The arrangement of the various elements inside the peripheral structure is, after all, not irrelevant: first of all, the peripheral short-circuit regions 15 represent a cathode short circuit as a result of making contact with the cathode contact 2. This short circuit forms the boundary of the entire periphery of the MCT. As already noted, this cathode short circuit will inactivate a few MCT cells. As a result of the integrated IGBT function, which is capable of donating electrons, the electron deficiency of the MCT cells can be removed with the aid of a positive gate signal.

In this connection, consideration has been given to maintaining the gate signal even during the turned-on state. Obviously, the entire device can also be turned on from a blocking state by a positive gate signal. This solution is particularly elegant for large-area MCTs which are built up from a large number of segments SE. Each segment SE has an area of, typically, 1 to 2 mm² and is surrounded by the peripheral short-circuit regions 15 described and comprising integrated IGBTs. With such a small area, no further complexity is necessary for turning-on.

In this application of IGBTs, the latching-up problem inherent in these devices must not be forgotten: in the presence of high current densities, the IGBT tends to lapse into a parasitic thyristor-type mode of operation. In the situation considered here, there is also the fact that it is precisely from the outer space that high current densities flow towards the cathode periphery. In the arrangement shown in FIG. 2, the objective is that said currents already flow into the peripheral short-circuit regions 15 at the outside edge, with the result that the IGBT structure is able to fulfill its function undisturbed on the inside, as it were, in the region shielded from the wind. It will therefore not be beneficial to dispose IGBT structures on the inside edge and outside edge of the peripheral short-circuit regions 15.

To alleviate the latching-up problem mentioned still further, it is advantageous not to allow the n+-doped source regions 17 of the IGBT structure to extend round continuously with the peripheral short-circuit regions 15, but to interrupt them periodically, with the result that they are of insular construction. Such an embodiment is shown in the cathode-side plan view in FIG. 3A and in the associated cross section in FIG. 3B. The separate source regions 17 then define individual IGBT cells IGC, which are similar in shape to the MCT cells Mn they surround.

The channels provided in this way between the IGBT cells IGC permit any holes which may be present to reach the peripheral short-circuit region 15 directly, even from the inside. This is a requirement to prevent latching-up. In a further embodiment, which is not shown, it is conceivable to connect guard rings to the frame-like peripheral short-circuit regions in the outer space (as indicated in FIG. 1B), or even to link them to a field-plate technology.

Figure 4:
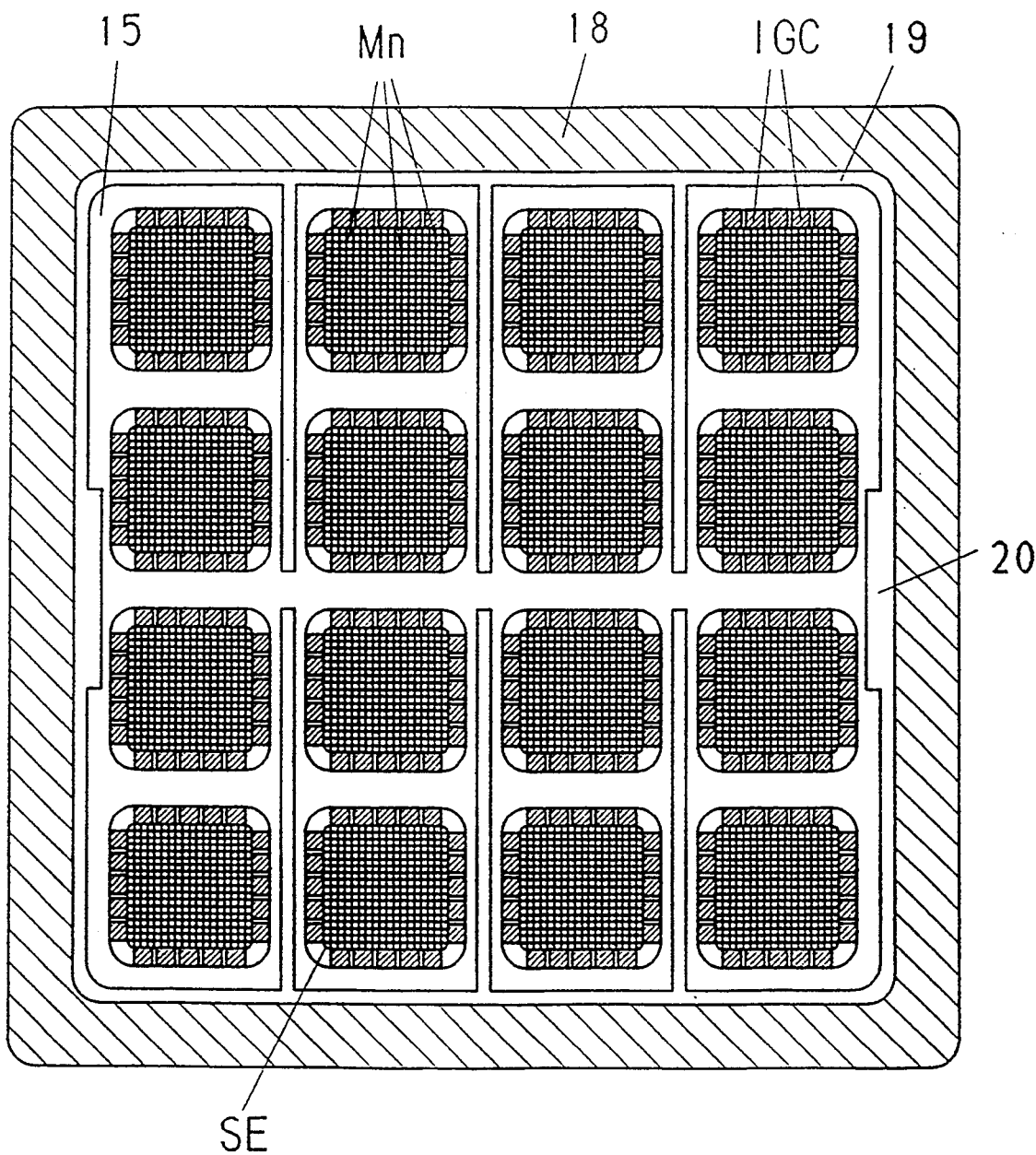
FIG. 4 shows, in plan view, an exemplary embodiment of the construction of a complete device having a multiplicity of segments, which each comprise in turn a multiplicity of MCT cells, and a peripheral termination.

Finally, a complete device of the type shown in FIGS. 3A and B is shown in plan view in FIG. 4. The active area is subdivided here into a multiplicity of (sixteen) segments SE, which each contain several 100 to a few 1000 MCT cells Mn. The segments SE are surrounded in a grid-like manner by the short-circuit region 15. Adjacent to the peripheral short-circuit region 15 on the outside is a conventional peripheral termination 18 which frames the entire device. Gate metallization 19 separated from the cathode K surrounds the device as a whole and has, at certain points, bonding pads 20 in the form of widened sections which are provided for the electrical connection of the gates.

Obviously, instead of the doping of the layers and regions shown in the figures, the doping complementary thereto may also be provided within the scope of the invention.

All in all, the invention provides an MCT in which the current-density overshoots occurring at the periphery of the active area are reduced to a harmless level or eliminated entirely.

Obviously, numerous modifications and variations of the present invention are possible in light of the above teachings. It is therefore to be understood that within the scope of the appended claims, the invention may be practiced otherwise than as specifically described herein.

(NB intended only for the examiner; not part of the application)

LIST OF DESIGNATIONS

1 Semiconductor substrate
2 Cathode contact
3 Gate insulation
4 Gate electrode
5 Peripheral passivation
6,7 Base layer
8 Emitter layer
9 Anode contact
10,15 Peripheral short-circuit region
11 Peripheral termination region
12 Emitter region
13,16 Channel region
14 Cathode short-circuit region
17 Source region
18 Peripheral termination
19 Gate metallization
20 Bonding pad
A Anode
GR1,GR2 Guard ring
IGC IGBT cell
K Cathode
M1, . . . , M3, MCT cell
Mn MCT cell
SE Segment

What is claimed as new and desired to be secured by Letters Patent of the United States is:

1. A turn-off power semiconductor device comprising:
   (a) a semiconductor substrate having two oppositely situated anode and cathode principal faces respectively defining an anode surface and a cathode surface, said cathode surface including a cathode metallization and said anode surface including an anode metallization;
   (b) between the anode and cathode surfaces inside the semiconductor substrate, plural active unit cells each including a layer sequence comprising, from the anode surface to the cathode surface, an emitter layer of a first conductivity type, a first base layer of a second conductivity type opposite to the first conductivity type, and a second base layer of the first conductivity type, and a second base layer of the first conductivity type; and
   (c) between the anode and the cathode surfaces inside the semiconductor substrate, plural adjacently disposed turn-off unit cells each comprising a cathode contact and an anode contact, said turn-off unit cells connected in parallel by means of said anode and cathode contacts being connected to respective of said anode and cathode metallizations;
   wherein:
   (d) said plural active unit cells are arranged into plural segments, each segment comprising more than two of said plural active unit cells;
   (e) each segment is surrounded at its periphery in a lateral direction by respective peripheral short-circuit regions of the first conductivity type which extract charge from the semiconductor substrate;
   (f) the peripheral short-circuit regions extend from the cathode surface into the semiconductor substrate and are conductively connected to the cathode metallization disposed on the cathode surface;
   (g) the second base layer extends laterally only to one segment and, outside the segments, the first base layer emerges at the cathode surface; and
   (h) the peripheral short-circuit regions are embedded in the first base layer.

2. The device as claimed in claim 1, wherein
   (a) the device is formed as an MOS-controlled thyristor and the active unit cells are each formed as MCT cells;
   (b) an emitter region of the second conductivity type, which is embedded in the second base layer and to which contact is made from the cathode surface by the cathode metallization, being disposed inside each MCT cell; and
   (e) an MOS structure, which forms a switchable short circuit between the second base layer and the cathode metallization, being provided inside each MCT cell on the cathode surface.

3. The device as claimed in claim 2, wherein the peripheral short-circuit regions are embedded in the second base layer.

4. The device as claimed in claim 1, wherein MOS-controlled short circuits, which make a switchable connection between the cathode metallization and the first base layer and, together with the peripheral short-circuit regions, the first base layer and the emitter layer form IGBT structures, are provided inside the peripheral short-circuit regions.

5. The device as claimed in claim 4, wherein the MOS-controlled short circuits are disposed in the peripheral short-circuit regions only adjacent to the segments.

6. The device as claimed in claim 5, wherein
   (a) the MOS-controlled short circuits in the IGBT structures comprise channel regions of the first conductivity type and source regions of the second conductivity type; and
   (b) the source regions are of insular construction and define a multiplicity of separate IGBT cells.

7. The device as claimed in any claim 1, wherein the peripheral short-circuit regions are of insular construction.

8. The device as claimed in any of claims 1, 2, 3, 4, 5 or 6, wherein the peripheral short-circuit regions form a grid which surrounds the separate segments.

9. The device as claimed in any of claims 1, 2, 3, 4, 5 or 6, wherein
   (a) a peripheral termination region, including guard rings, is provided outside the peripheral short-circuit regions; and
   (b) an active area formed by the segments on the cathode side is surrounded on the outside by a gate metallization which is separated from the cathode metallization.

10. The device as claimed in claim 1, wherein the emitter layer is $p^+$-doped, the first base layer is $n^-$-doped, the second base layer is p-doped, the emitter regions are $n^+$-doped and the peripheral short-circuit regions are $p^+$-doped.

11. The device as claimed in claim 1, wherein the peripheral short-circuit regions are constructed as continuous strips.

* * * * *